United States Patent
Brandt et al.

(10) Patent No.: US 7,602,617 B2
(45) Date of Patent: Oct. 13, 2009

(54) ON-MACHINE BACKPLANE MOUNTED MODULAR POWER AND DATA DISTRIBUTION SYSTEM

(75) Inventors: David D. Brandt, New Berlin, WI (US); Wayne H. Wielebski, New Berlin, WI (US); Neil Gollhardt, Fox Point, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 493 days.

(21) Appl. No.: 11/240,989

(22) Filed: Sep. 30, 2005

(65) Prior Publication Data
US 2007/0076394 A1 Apr. 5, 2007

(51) Int. Cl.
*H01R 12/16* (2006.01)
(52) U.S. Cl. .................. 361/788; 361/796; 361/798
(58) Field of Classification Search .......... 361/788, 361/796–798; 710/300–305
See application file for complete search history.

(56) References Cited

U.S. PATENT DOCUMENTS

| | | | | |
|---|---|---|---|---|
| 5,301,303 A | * | 4/1994 | Abraham et al. | 709/223 |
| 6,377,874 B1 | * | 4/2002 | Ykema | 700/286 |
| 6,477,291 B1 | * | 11/2002 | Ramadas | 385/17 |
| 7,042,735 B2 | * | 5/2006 | Koga et al. | 361/788 |

* cited by examiner

*Primary Examiner*—Tuan T Dinh
(74) *Attorney, Agent, or Firm*—Fletcher Yoder Law; Alexander R. Kuszewski

(57) ABSTRACT

A backplane configuration is described for supporting a range of modular components mechanically and for making electrical connections between the components. The backplane is particularly well-suited to power distribution and control applications, such as in industrial motor drives, and so forth. The backplane includes a number of bays or slots for modular components, as well as a bus topography that allows for switched or common connections between the various components.

15 Claims, 4 Drawing Sheets

ON-MACHINE BACKPLANE MOUNTED MODULAR POWER AND DATA DISTRIBUTION SYSTEM

BACKGROUND

The present invention relates generally to electrical control and monitoring systems, such as systems used in industrial and other electrical power applications. More particularly, the invention relates to a technique for mounting and interfacing of power control devices, particularly well-suited to use at or near a driven or powered load.

A wide range of applications exist for applying and controlling electrical power in industrial, marine, agricultural, commercial and other settings. The many such applications, a powered load, such as an electric motor, is provided with single or three-phase electrical power. The power originates in the power grid, and is channeled to the application through various distribution circuits and, ultimately, protective circuitry and switch gear at or near the load. In industrial applications, for example, motors have traditionally been controlled through a range of devices that are mounted in and interlinked in large electrical enclosures or cabinets, typically called motor control centers (MCC).

A growing alternative to MCCs involves the separation of power distribution, control and monitoring circuitry to locate individual and distributed systems near the actual loads that they control. For example, an industrial setting, many motors and other actuators may be controlled for a particular machine process. On-machine systems are being designed to control one or a handful of such motors via distributed systems located near the individual motors and mounted to a machine frame. Such applications, while potentially reducing costs and improving local control, pose substantial difficulties. For example, the on-machine environments are often subjected to considerable vibration and environments around the machine systems are potentially less controlled than are those in a central enclosure. However, the benefits of local control, reduced wiring costs, and decentralization of functionality help to drive such solutions.

Existing on-machine control and monitoring systems are generally packaged as a pre-designed unit. That is, all necessary drives, drive circuitry, protective circuitry, switch gear and the like are included in a packaged enclosure. While such solutions are workable, further improvements are believed useful. For example, there is a need in the art for systems that will facilitate a modular approach to selection and interfacing of protective circuitry, drive circuitry, switchgear, and the like. Similarly, there is a need for a system that will permit environmentally-controlled electrical interfacing in a package that can be expanded or contracted to meet the local power distribution and control needs.

BRIEF DESCRIPTION

The present invention provides a novel approach to on-machine control and monitoring systems designed to respond to such needs. The invention may be used with a wide range of machines and applications, and is particularly well-suited to industrial applications, such as for controlling loads and actuators, particularly electrical motors. The technique is based upon the provision of a powered backplane designed to mechanically support and electrically interface a range of components. The components may include any suitable protective circuitry, switch gear, drives, and so forth. The circuitry may also include input/output (I/O) interfaces for sensors and actuators, and so forth.

The backplane is made so as to provide bays or locations at which the devices, which will typically be designed as modular units, can be installed and sealed, thereby enclosing an environment both within the modules and the backplane. The backplane provides for distribution of power and data signals, enabling the devices to be interfaced with a network. The distribution of power in the backplane can follow various topologies, so as to permit interruption of power to downstream components, such as via modular protective circuitry, while allowing certain components to share common service, such as for control power and data. The backplanes can also be designed or associated with other backplanes to provide parallel and independent power and control of different loads, such as various motors at or near a particular machine location.

DRAWINGS

These and other features, aspects, and advantages of the present invention will become better understood when the following detailed description is read with reference to the accompanying drawings in which like characters represent like parts throughout the drawings, wherein.

Figure 2:
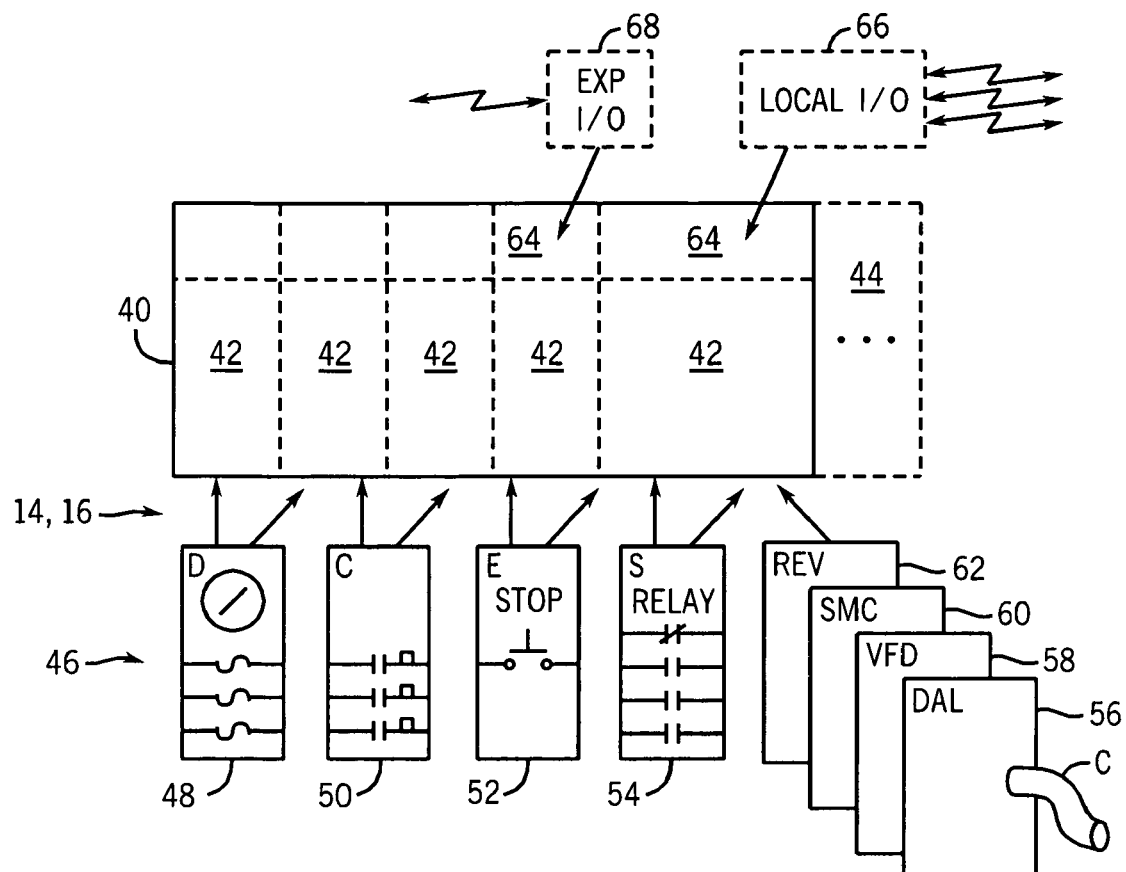
FIG. 2 is diagrammatical representation of a backplane for the system of FIG. 1 illustrating bays or locations, and control and monitoring modules that can be located at the various positions to create the desired load control and monitoring system.
Figure 3:
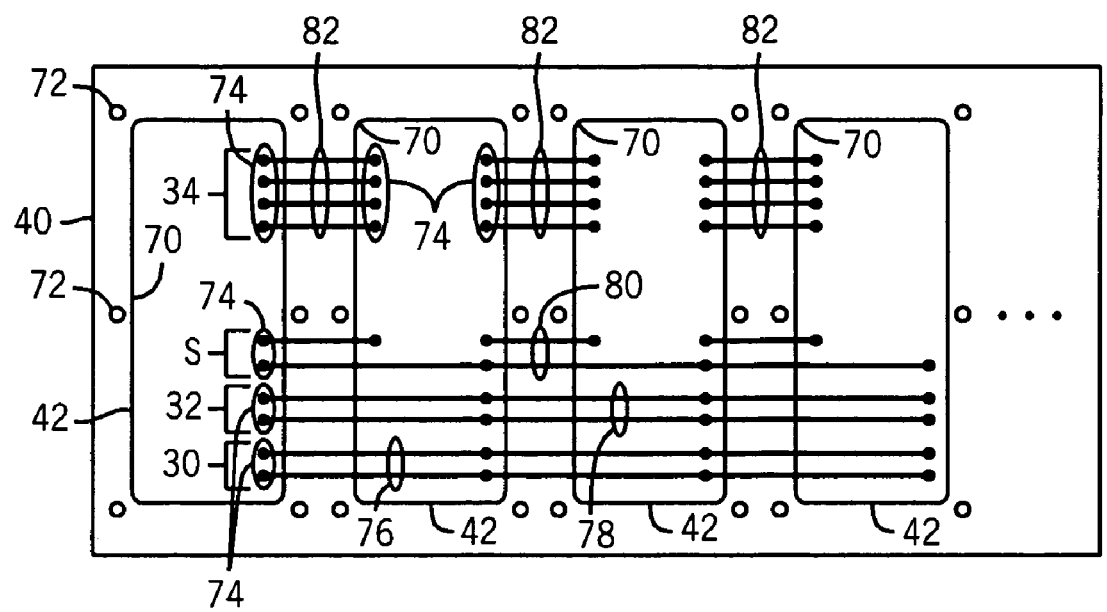
Figure 4:
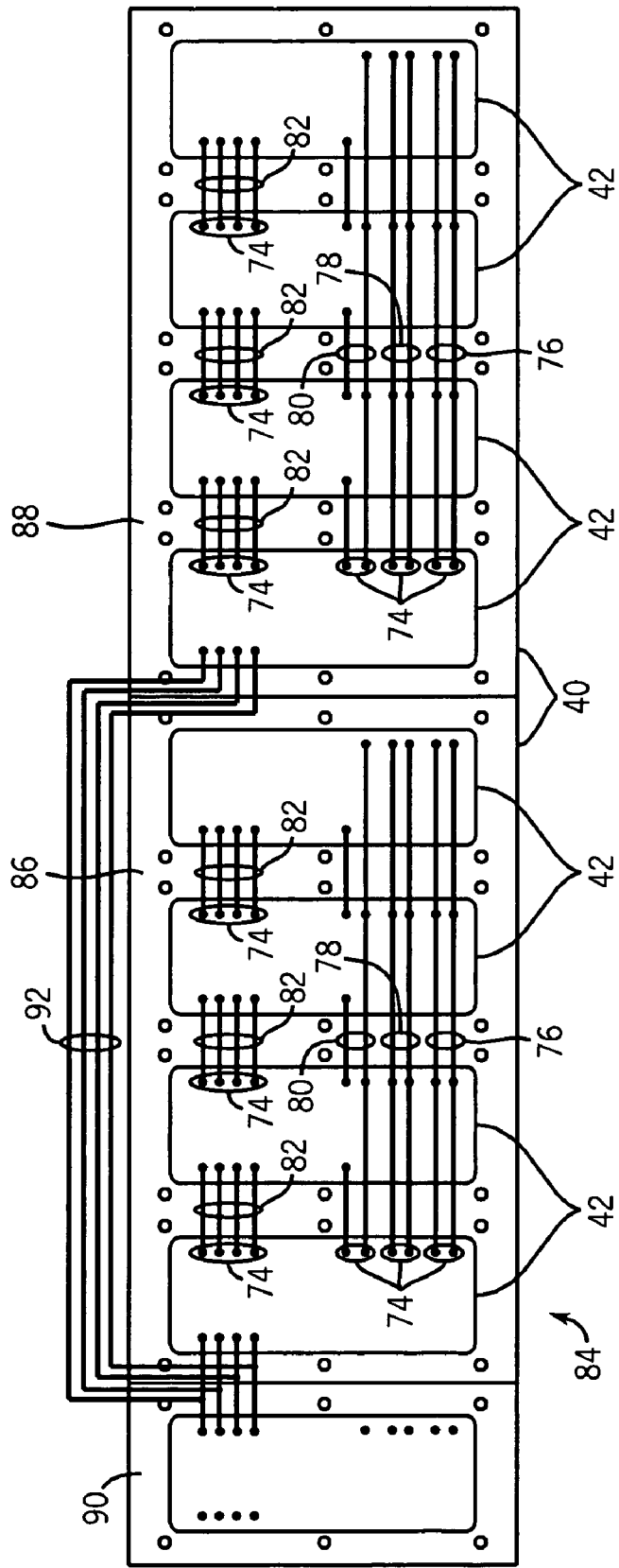

FIG. 3 is an exemplary wiring topology for a backplane of the type shown in FIG. 2, illustrating an exemplary manner in which power may be routed within the backplane to provide for switching of power for application to a load, and common service for control power and data; and FIG. 4 is a diagrammatical representation of a backplane wiring topology similar to that of claim 3, but illustrating a manner in which multiple backplanes or backplane areas can be associated with one another so as to provide for independent monitoring and control of multiple loads at a single location.

DETAILED DESCRIPTION

Figure 1:
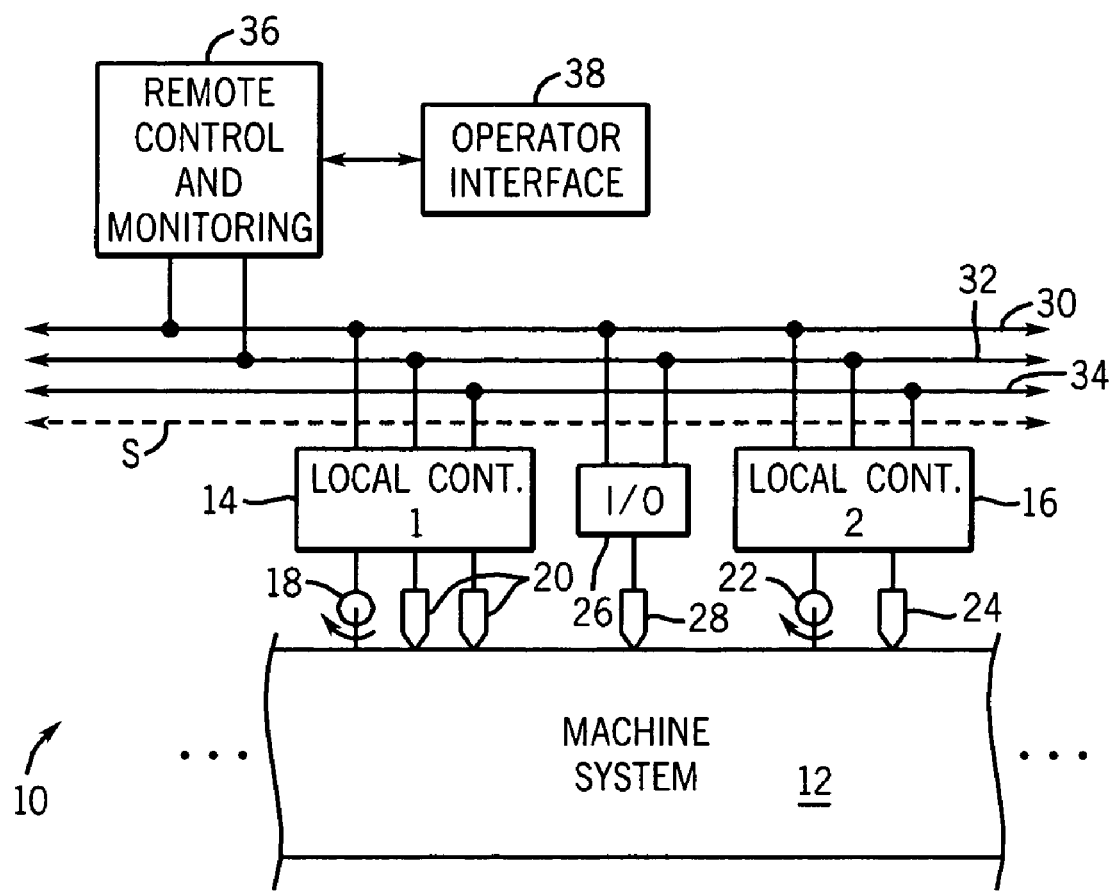
FIG. 1 is diagrammatical representation of a control and monitoring system incorporating a power backplane in accordance with aspects of the present technique.

Turning now to the drawings, and referring first to FIG. 1, a control and monitoring system is illustrated and designated generally by reference numeral 10. System 10 includes various components for applying electrical power to a machine system, represented generally at reference numeral 12. As will be appreciated by those skilled in the art, the machine system 12 may be any of a wide range of machines systems that have powered loads and points at which certain sensed data is collected for control and monitoring purposes. Examples of such machines systems in industrial settings might include manufacturing processes, assembly lines, material handling and conveyers, chemical process controls, fluid handling systems, and so forth. The present techniques are not intended to be limited to any particular type of machine system.

The control and monitoring system 10, as illustrated, includes a range of local controllers 14 and 16 that are located in the general vicinity of points where power is applied to the machine system 12 or where data is collected. The local controllers 14 and 16 may carryout a wide range of functions, such as for starting and stopping loads, such as electric motors, regulating application of power to the loads, sensing application of power to the loads, sensing parameters of the process to which the loads are applied, and so forth. In the illustrated example, local controller 14 controls a motor 18, and interfaces with a pair of sensors 20. The sensors may, for example, sense the performance of the motor 18 or may sense other machine parameters, such as elevations, speeds, vibration, the presence of a work piece, and so forth, to name only a few. Similarly, local controller 16 controls application and power to a motor 22, and interfaces with a sensor 24. As will be appreciated by those skilled in the art, many such controllers may be provided in a typical large machine system or process, and each local controller may be interfaces with a range of actuators and sensors. The system also includes stand-alone I/O modules as illustrated at reference numeral 26 that may be used to interface with other actuators and sensors, such as sensor 28.

The controllers 14 and 16, and I/O module 26 are coupled to power and data busses that provide for application of power to the loads, provision of control power, and exchange of network data. In the illustrated embodiment, a data bus 30 is coupled to each of the controllers and I/O module to exchange sensed and control data in accordance with a suitable protocol. By way of example, in an industrial setting, known protocols might include the DeviceNet protocol. A control power bus 32 is provided and coupled to the controllers for providing control power. As will be appreciated by those skilled in the art, control power generally is either ac or dc power (e.g., 110vac or 24vdc) that enables switching devices, actuators, and sensors to perform their tasks.

In general, in many applications it is desired to provide control power that can be independently switched from the power applied to the loads, permitting testing and servicing of the controllers without power actually being applied to the loads. Similarly, a power bus 34 is provided for distribution of the power to be applied to the loads. In a typical industrial setting, the power bus will include four conductors for three-phase power and a ground. A neutral conductor may also be provided in the bus, were desired. The invention is not, however, limited to the application of three-phase power, but is equally applicable to systems distributing single-phase power.

In certain settings, a supplementary bus which may be referred to as an E-stop bus, represented by the dashed line capital S may also be provided. As will be appreciated by those skilled in the industrial arts, E-stop circuits (a term coined to refer to "emergency stop" circuits) are provided for interrupting power to certain loads in the event of the need for a rapid removal of power. In many settings, an E-stop bus will be interfaced with conspicuous push buttons to allow personnel to positively stop a process when needed.

While the local controllers may generally function virtually completely independently, in many settings it may be desirable to convey control and monitoring signals between these controllers and remote control and monitoring equipment. For example, in an industrial setting, such equipment may include programmable logic controllers, remote computer systems, various associated controllers in control rooms or control locations, and so forth. One such remote control and monitoring system 36 is illustrated in FIG. 1 as coupled to the data bus 30 and to the control power bus 32. As will be appreciated by those skilled in the art, such monitoring and control equipment may include operator interfaces 38 of various types. Such operator interfaces may include conventional computer monitors, keyboards, by-hand input devices, and the like. In certain settings, moreover, the interfaces will include human machine interfaces (HMIs) dedicated for the particular process to be controlled. It should be also noted that such operator interfaces may be provided at each local controller 14 and 16, where desired.

FIG. 2 illustrates an exemplary backplane configuration for use in a local controller such as controller 14 or 16 of FIG. 1. As shown, the backplane 40 will comprise a rigid mechanical structure, such as a thin metal enclosure, plastic enclosure, or a composite assembly which will define bays or locations 42 for locating module components. In an exemplary implementation, the backplane will be isolated from vibration on a machine frame via shock absorbing materials that can be mounted between the machine frame and the backplane. Such shock absorbing materials may include rubber grommets, a shock absorbing layer or sheet, and so forth. The backplane extends over an area to be occupied by the components, and may arrange the bays horizontally, vertically, or in a combination of patterns and topographies. The backplane may be made in standard dimensions, and where no modular component is place in a particular bay, such bays may be covered and sealed. Where desired, multiple sizes or configurations of the backplanes may be made, such as to accommodate various anticipated typical system configurations, system dimensions, and the like. Similarly, extensions, represented generally by reference numeral 44 may be provided for accommodating additional components, I/O modules, and independently operated system components as described in greater detail below.

In a presently contemplated embodiment, the modular components are designed to control and monitor application of electrical power to loads, such as, by way of example, electric motors. The components generally are designated in FIG. 2 by the reference numeral 46. A typical application may include a modular circuit protector or disconnect 48, a contactor 50, an E-stop module 52, and a safety relay 54. As will be appreciated by those skilled in the art, such components will typically be placed in a set or predetermined order depending upon their function in the overall system. For example, a disconnect and fuses as illustrated for module 48 will typically be placed electrically upstream of the contactor 50. The arrows in FIG. 2 illustrate, however, that in certain applications there can be some degree of freedom as to which bay the individual modules occupy. Where applicable, for example, a contactor may be placed downstream of a fused disconnect but upstream of or adjacent to a safety relay such as illustrated at reference numeral 54. The various components occupying the bays 42 will generally have their same function and may be based upon existing components in the art. However, their configuration and packaging is such that they can be mounted on, mechanically supported on, and electrically interfaced with the backplane 40.

In a presently contemplated embodiment, in addition to the protective components and switchgear components mentioned above, the backplane 40 can support a range of drives or control devices. In the illustrated embodiment, for example, these may include a direct across-the-line starter 56, a variable frequency drive 58, a smart motor controller 60 and a reversing motor starter 62. In the presently contemplated embodiments, such components would be configured to be placed in and interface with the backplane and the remaining components in a modular manner. That is, packaging for each of the components for driving a motor in accordance with various specifications and needs may be interchangeable such that a system may use the same backplane and many of the same modular components, with the control or drive elements being selected according to the application. It should also be noted that because the backplane 40 will be configured for mounting locally to a monitored or controlled point in a machine system, as indicated by a local controller 14 and 16 in FIG. 1, power to the ultimate load may be provided by either shielded cable, multi-conductor cable, or conduit. In a presently contemplated embodiment, for example, a flexible cable, designated generally by the reference C in FIG. 2, is connected to the drive or control module and extends to the application.

In addition to the foregoing components, it is presently contemplated that the on-machine backplane 40 will accommodate various interfaces for input and output devices, such as actuators and sensors. In the embodiment illustrated in FIG. 2, a generally horizontal row of such interfaces may be provided at I/O slots or bays 64. By way of example, local I/O 66 may be interfaced with both the network and, where appropriate, the control power busses and with other components mounted on the backplane 40. Similarly, expansion I/O 68 may be provided in additional slots or bays and similarly interfaced with the network. The arrangement, then, allows for both the local and monitoring of processes, and the support of other actuator and sensor interfaces in an integrated unit.

FIG. 3 illustrates an exemplary connection topology for an on-machine backplane 40 of the type described above. As noted above, the backplane will typically permit switched connections to be made, particularly for the power applied to loads, while certain common service will be provided for some or all of the bays or slots. In the embodiment illustrated in FIG. 3, for example, the backplane 40 includes a series of cut-outs or openings at which the modular components are mounted. The modular components may be attached to the backplane so as to fit generally in a conforming periphery 70, with attachment being provided by lugs or screw attachments as indicated generally at reference numeral 72. Other mechanisms for attachment may, of course, be provided, such as snap-in and pluggable attachments, brackets, and so forth. The presently contemplated backplane also will allow for sealing between each of the components and the backplane, to enclose the interior of the backplane and any space between or within the components and the backplane. Such sealing will typically be made within or immediately adjacent to the periphery 70 of each bay.

Within the backplane, and as indicated diagrammatically in FIG. 3, a routing topography for conductors or busses will correspond to the logical use made of the module components, either switched or common. That is, as illustrated at reference numeral 74 in FIG. 3, busses will be typically terminated at terminals 74 and routed between such terminals to convey power between or among the bays. The terminals may permit either terminated or plugged-in attachment of the modular components within the bay to facilitate their termination and installation, as well as their removal for maintenance and replacement.

In the example illustrated in FIG. 3, common service busses might include data bus conductors 76 which convey data to all bays and that will be ultimately terminated to network media as discussed above with reference to FIG. 1. Similarly, common service may include control power conductors 78 that route control power to all bays where such power may be needed. Of course, where a modular component does not require control power or data, the busses may nevertheless be present in the backplane, but no connection made to the components.

As will be appreciated by those skilled in the art, E-stop connections typically allow for emergency stopping or interruption of power by any one of a variety of components. Thus, a topography for E-stop busses, indicated generally at reference numeral 80 in FIG. 3, may provide for a common conductor and separate conductors so that a complete loop circuit can be defined by all of the modular components and interruption permitted by any one of the components.

Similarly, the three-phase power conductors 82 illustrated in FIG. 3 will typically allow for switching or interruption by a variety of components. For example, a master disconnect and fuses may be provided in a first module and interfaced so as to permit interruption of power to all downstream components. Similar separate busses may be terminated and coupled to contactors, for example, at an intermediate position to allow the contactor to make and break connections downstream so as to isolate the downstream circuitry where desired. Similar separated busses will typically be provided for E-stops, safety relays, and so forth.

FIG. 4 represents a variant on the arrangement shown in FIG. 3, particularly adapted for a multi-unit backplane 84. The backplane 84 is illustrated diagrammatically to demonstrate how certain connections can be made to permit components and systems to be co-located while operating independently. In the illustrated example, for example, a first modular backplane 86 is associated with a second modular backplane 88. In practice, the two backplanes may form a single unit but provide for separate operation of motors, actuators, and other loads. In the illustrated embodiment an incoming power expansion bay 90 is provided for a fused disconnect that supplies power to the entire multi-unit backplane 84. Downstream of this fused disconnect bay, terminations are made to the first slot or bay of backplane 86, and power jumpers 92 route power to a first slot or bay of backplane 88. Thus, a variety of modular components can be mounted and supported on each of the backplanes, and supply power to loads completely independently of one another. Topographies for routing of power and data within the backplanes can be generally similar to that described above with reference to FIG. 3.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An on-machine modular electrical monitoring and control system comprising:
   a backplane configured to mechanically support a plurality of system components;
   switchable power buses disposed on or in the backplane for carrying three-phase switched electrical power; common service buses disposed on or in the backplane for carrying control power and data signals;
   a switchable power module pluggable to the backplane for establishing an interruptible three-phase current path between the switchable power buses; and
   a motor control module pluggable to the backplane and receiving three-phase electrical power via the switchable power module, and power and data signals via the common service buses; wherein the backplane is configured to support a plurality of independently operating switchable power modules and motor control modules.

2. The system of claim 1, wherein the switchable power module includes an overload protection module.

3. The system of claim 1, wherein the switchable power module includes a circuit breaker.

4. The system of claim 1, wherein the switchable power module includes a manual disconnect.

5. The system of claim 1, wherein the switchable power module includes a remotely controlled relay.

6. An on-machine modular electrical monitoring and control system comprising:
- a backplane configured to mechanically support a plurality of system components;
- switchable power buses disposed on or in the backplane for carrying three-phase switched electrical power;
- at least one common service bus disposed on or in the backplane for carrying control power and data signals;
- a switchable power module pluggable to the backplane for establishing an interruptible three-phase current path between the switchable power buses; and
- a motor control module pluggable to the backplane and receiving three-phase electrical power via the switchable power module, and power and data signals via the common service buses; wherein the backplane is configured to support a plurality of independently operating switchable power modules and motor control modules.

7. The system of claim 6, wherein the switchable power module includes an overload protection module.

8. The system of claim 6, wherein the switchable power module includes a circuit breaker.

9. The system of claim 6, wherein the switchable power module includes a manual disconnect.

10. The system of claim 6, wherein the switchable power module includes a remotely controlled relay.

11. An on-machine modular electrical monitoring and control system comprising:
- a backplane configured to mechanically support a plurality of system components;
- switchable power buses disposed on or in the backplane for carrying three-phase switched electrical power;
- at least one common service bus disposed on or in the backplane for carrying control power and data signals;
- a switchable power module coupled to the backplane for establishing an interruptible three-phase current path between the switchable power buses; and
- a motor control module coupled to the backplane and receiving three-phase electrical power via the switchable power module, and power and data signals via the common service buses; wherein the backplane is configured to support a plurality of independently operating switchable power modules and motor control modules.

12. The system of claim 11, wherein the switchable power module includes an overload protection module.

13. The system of claim 11, wherein the switchable power module includes a circuit breaker.

14. The system of claim 11, wherein the switchable power module includes a manual disconnect.

15. The system of claim 11, wherein the switchable power module includes a remotely controlled relay.

* * * * *

UNITED STATES PATENT AND TRADEMARK OFFICE
CERTIFICATE OF CORRECTION

PATENT NO. : 7,602,617 B2 Page 1 of 1
APPLICATION NO. : 11/240989
DATED : October 13, 2009
INVENTOR(S) : Brandt et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 871 days.

Signed and Sealed this

Fifth Day of October, 2010

David J. Kappos
*Director of the United States Patent and Trademark Office*